(12) United States Patent
Yun et al.

(10) Patent No.: US 7,538,949 B2
(45) Date of Patent: May 26, 2009

(54) IMAGE SENSOR AND MANUFACTURING METHOD THEREOF

(75) Inventors: Young Je Yun, Arnsan-si (KR); Jin Ho Park, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/842,663

(22) Filed: Aug. 21, 2007

(65) Prior Publication Data

US 2008/0158683 A1  Jul. 3, 2008

(30) Foreign Application Priority Data

Dec. 27, 2006  (KR) ...................... 10-2006-0135715
Dec. 27, 2006  (KR) ...................... 10-2006-0135716

(51) Int. Cl.
*G02B 27/10*  (2006.01)
*B29D 11/00*  (2006.01)

(52) U.S. Cl. ........................................ 359/620; 264/1.1

(58) Field of Classification Search ......... 359/618–621, 359/626, 443, 454–455; 264/1.1, 1.32, 1.7, 264/2.7

See application file for complete search history.

(56) References Cited

U.S. PATENT DOCUMENTS

2005/0078377 A1* 4/2005 Li et al. ...................... 359/619

FOREIGN PATENT DOCUMENTS

KR   10-2001-0037389   1/2003
KR   10-2004-0045729   12/2005

* cited by examiner

*Primary Examiner*—Scott J Sugarman
*Assistant Examiner*—Dawayne A Pinkney
(74) *Attorney, Agent, or Firm*—Saliwanchik, Lloyd & Saliwanchik

(57) ABSTRACT

An image sensor and method for fabricating an image sensor are provided. The image sensor includes a substrate and a microlens array in a checkerboard pattern. In some embodiments, the checkerboard pattern involves alternating hydrophilic and hydrophobic microlenses.

17 Claims, 5 Drawing Sheets

IMAGE SENSOR AND MANUFACTURING METHOD THEREOF

CROSS-REFERENCE TO RELATED APPLICATION

The present application claims the benefit under 35 U.S.C. § 119 of Korean Patent Application No. 10-2006-0135715, filed on Dec. 27, 2006, and Korean Patent Application No. 10-2006-0135716, filed on Dec. 27, 2006, which are each hereby incorporated by reference in their entirety.

BACKGROUND

An image sensor is a semiconductor device that converts an optical image into an electrical signal. The fabrication process is very important in determining the performance of an image sensor. Two important processes are the color filter array (CFA) and microlens (ML) formation processes.

In a microlens formation process, there are typically gaps formed between neighboring microlenses. These gaps cause the image sensor's performance to suffer. Several studies and simulations have demonstrated that when the gaps are small, the photo sensitivity of the image sensor can be improved by more than 15%.

A typical microlens formation process in the related art uses an organic material in the form of a photoresist (PR) in which a thermal reflow is possible using thermal energy. In particular, a pattern is first formed at a position where a lens will be disposed by performing a lithography method using photoresist material. Next, heat is applied to the material to reflow it so that a spherical curve is formed. Then, it is cooled, thereby completing the fabrication of a lens.

In a typical microlens formation process, the width of the gaps between the microlenses is determined by a pattern formed through photolithography before reflowing the material. Accordingly, the minimum gap width is often limited to about 50 nm due to the current limitations of lithography resolution. Furthermore, when the material is reflowed so that the gaps between the microlenses are narrowed to less than 50 nm, neighboring microlenses may merge together during the reflow process, raising the probability that lens bridges will form. Thus, current microlens formation processes cannot form a microlens having a complete zero gap.

Lens bridges occur because of the mixing phenomenon present when hydrophobic materials come in contact with each other, such as when the hydrophobic photoresist comes in contact with a neighboring hydrophobic lens. This phenomenon is similar to when two water drops come in contact with each other on a glass window and are drawn together. As shown in FIG. 1, since the photoresist for forming the lens has a predetermined degree of viscosity in the fluid state, a gentle bend is generally formed between the photoresists 1 for forming the lens, thus generating a lens bridge.

BRIEF SUMMARY

Embodiments of the present invention provide an image sensor and a fabricating method thereof capable of inhibiting the generation of a lens bridge between neighboring pixels of a microlens and forming a microlens having a zero gap to improve the characteristics of a device.

An image sensor according to an embodiment of the subject invention includes a lower structure having a photodiode; a passivation layer formed over the lower structure; and a microlens array formed on the passivation layer, and having a first set of microlenses formed of a hydrophilic material and a second set of microlenses formed of a hydrophobic material.

A fabricating method of an image sensor according to an embodiment of the present invention includes forming a lower structure having a photodiode; forming a passivation layer over the lower structure; forming a planarization layer over the passivation layer; forming a first photosensitive film patterned over the planarization layer; forming sacrificial microlenses through heat treatment of the first photosensitive film; forming a first set of microlenses, to which the shape of the sacrificial microlenses is transcribed, on the planarization layer through an etching process; forming a second photosensitive film patterned in the space between microlenses constituting the first set of microlenses; and forming a microlens array constituted by the first set of microlenses and a second set of microlenses formed of the second photosensitive film through heat treatment.

An image sensor according to another embodiment of the present invention includes a planarization layer formed by being patterned into first and second regions and formed so that the upper surface of the second region is protruded more than that of the first region; and a microlens array having a first set of microlenses formed on the first region and a second set of microlenses formed on the second region.

An image sensor according to yet another embodiment of the present invention includes a hydrophilic layer; a planarization layer formed by being patterned into first and second regions on the hydrophilic layer, the first region being formed so that the hydrophilic layer is exposed and the second region being formed so that the hydrophilic layer is not exposed; and a microlens array having a first set of microlenses formed on the first region and a second set of microlenses formed on the second region.

A fabricating method of an image sensor according to an embodiment of the invention includes forming a planarization layer patterned by being divided into a first region and a second region and having the upper surface of the second region protruded more than that of the first region; and forming a microlens array having first and second sets of microlenses by forming the first set of microlenses on the first region and a second set of microlenses on the second region.

A fabricating method of an image sensor according to another embodiment of the present invention includes forming a hydrophilic layer; forming a planarization layer patterned by being divided into first and second regions on the hydrophilic layer, the first region being formed so that the hydrophilic layer is exposed and the second region being formed so that the hydrophilic layer is not exposed; and forming a microlens array having a first set of microlenses formed on the first region and a second set of microlenses formed on the second region.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
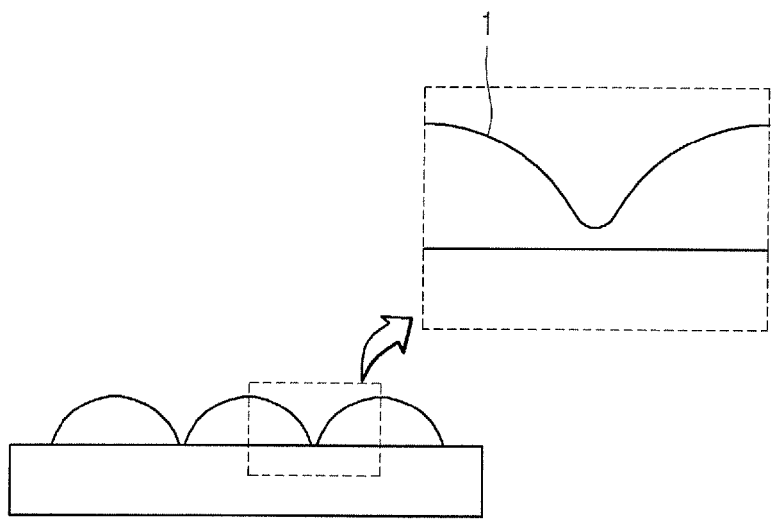
FIG. 1 shows a lens bridge generated by a fabricating method of an image sensor in the related art.
Figure 2:
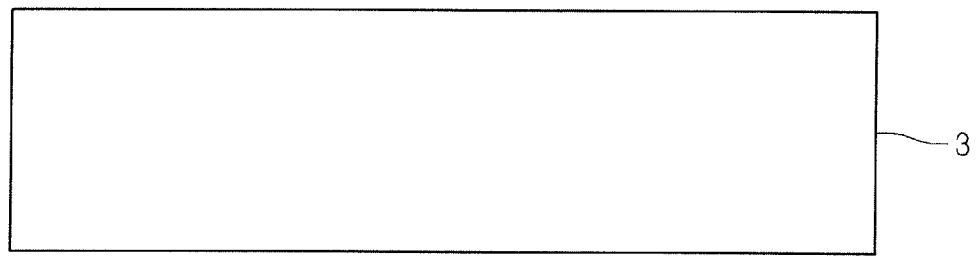
FIGS. 2 to 7 are views showing a fabricating method of an image sensor according to an embodiment of the present invention.

Referring to FIG. 2, in an embodiment of the fabricating method of the present invention, a lower layer 3 is formed before forming a microlens (ML) pattern. The lower layer 3 can be etched by means of a dry etching method, such as reactive ion etching (RIE). In many embodiments, the lower layer 3 is formed of a hydrophilic material.

In certain embodiments, the lower layer 3 serves as a planarization layer for a color filter array. In an embodiment, a lower structure having a photodiode and a passivation layer formed on the lower structure are included below the color filter array. In embodiments where the image sensor is designed such that an upper color filter array is not required, the lower layer 3 can serve as an additional layer.

In many embodiments, the material forming the planarization layer is capable of transmitting visible light well and, thus, has an imaginary reflective index (k~0). In typical image sensors, a color filter array is often formed on the upper portion of the image sensor, and the planarization layer is formed of a hydrophobic material. In certain embodiments of the present invention, though, a hydrophilic material is formed below the microlens array.

For example, low temperature oxides (LTOs) such as tetraethyl orthosilicates (TEOS) can be used. In embodiments where TEOS materials are used, a low-temperature oxidation (LTO) method capable of performing deposition at a temperature of about 220° C. is applied.

In embodiments incorporating TEOS, the step height difference of the color filter array may not be not completely removed after deposition because of the conformal property of TEOS. However, TEOS is excellent in coverage when performing the deposition. Accordingly, TEOS can play a role in mitigating the change of height at the step interface between neighboring pixels.

In embodiments where the image sensor is designed such that an upper color filter array is not required, a planar passivation layer is formed below the microlens array so that the TEOS layer can be formed by applying a chemical vapor deposition (CVD) method. The layer incorporating TEOS can be additionally used for a set of microlenses.

TEOS has an imaginary reflective index (RI) value of zero at the wavelengths of visible light and, at the same time, can be etched by a dry etching method. Accordingly, TEOS can serve as the lower layer of the microlens array.

In many embodiments, the lower layer 3 for forming the microlens array is thicker than a typical layer for forming a microlens. Since a photosensitive film is formed in the form of the microlens array by means of a dry etching method and transcribed to the lower layer 3, the thickness of the material of the lower layer 3 should be considered. TEOS has a real reflective index (RI) value of about 1.4 in the wavelengths of visible light. Thus, assuming that the distance from the microlens array to a lower photodiode is approximately 3 to 4 microns, the thickness of the lower layer 3 can be about 500 ml.

Figure 3:
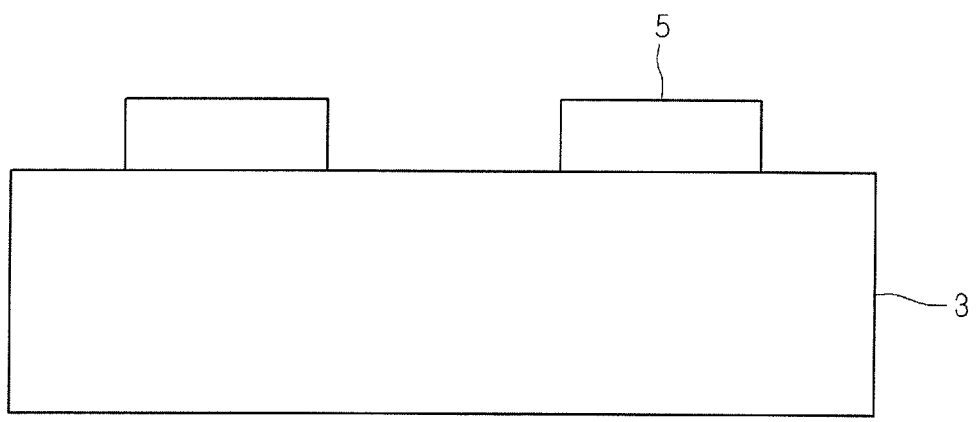

As shown in FIG. 3, in many embodiments, after forming the lower layer 3 having a thickness thicker than just for a microlens, a photosensitive film 5 is formed and patterned by a lithography method. Patterns are not formed for all pixels, but are formed for every other pixel, in the form of a checkerboard, such that there are not patterns in neighboring pixels.

Figure 4:
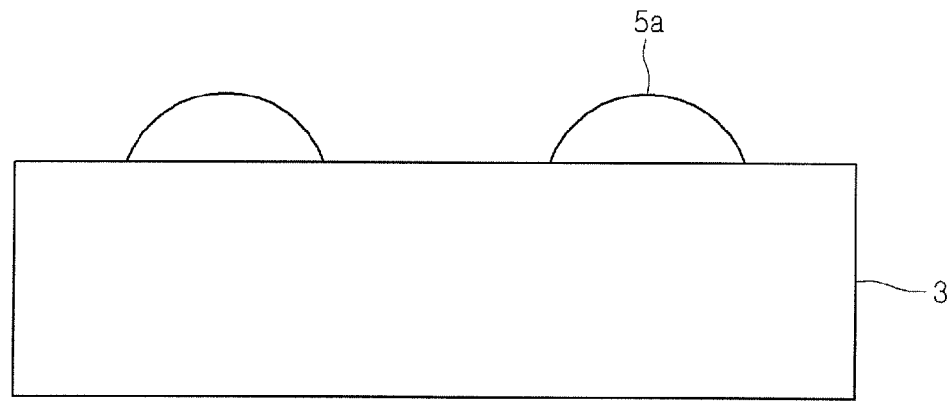

Referring to FIG. 4, after forming the patterns of the photosensitive film in the form of the checkerboard, the photosensitive film is re-formed into sacrificial microlenses 5a by a thermal reflow method.

Figure 5:
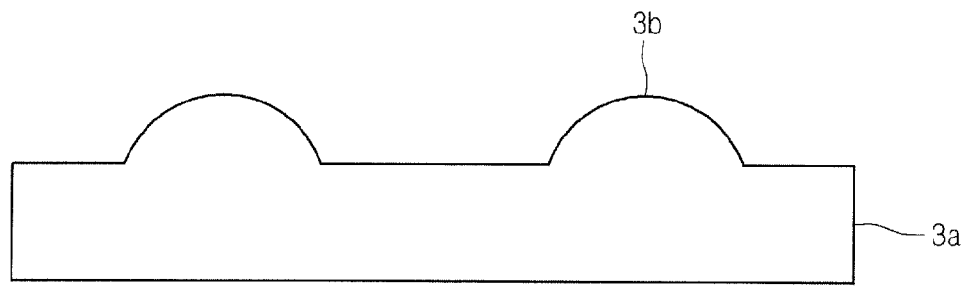

Referring to FIG. 5, after completing the sacrificial microlenses 5a, the material positioned as the lower layer 3 is bulk etched by a dry etching method. In one embodiment, the etching is a reactive ion etching (RIE) process. Accordingly, a first set of microlenses 3b are formed, to which the shape of the sacrificial microlenses is transcribed. The first set of microlenses 3b is formed in every other pixel on the lower layer 3a having the arrangement of a checkerboard. Accordingly, in many embodiments, the first set of microlenses 3b is formed of a hydrophilic material. For example, the material of the lower layer 3 is TEOS.

Figure 6:
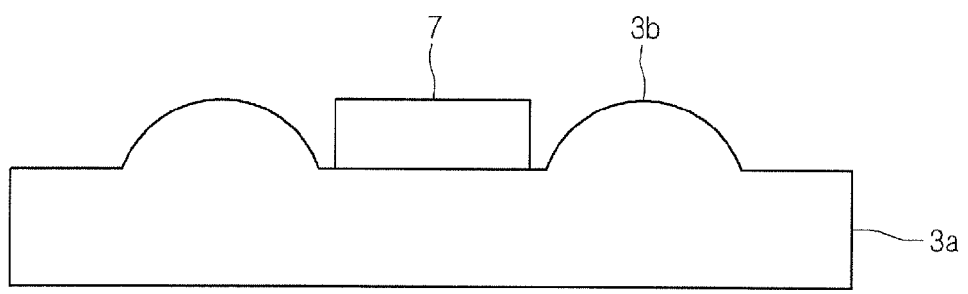

As shown in FIG. 6, a photosensitive film 7 can be formed in the arrangement of a checkerboard by a lithography method, at the pixel regions located between the first set of microlenses 3b formed of the hydrophilic material. In embodiments, the photosensitive film 7 can be formed of a photosensitive hydrophobic material. A photo mask can be used in the lithography process by moving it by pixel pitch vertically and horizontally.

Figure 7:
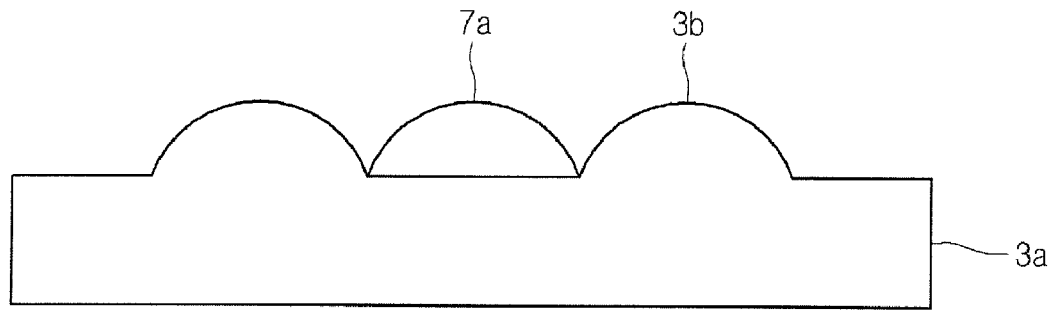

Referring FIG. 7, in many embodiments, a second set of microlenses 7a is formed by a heat treatment process such as thermal reflow. The second set of microlenses 7a can be formed of a hydrophobic material. Accordingly, a microlens array comprising the first set of microlenses 3b and the second set of microlenses 7a can be formed.

Figure 8:
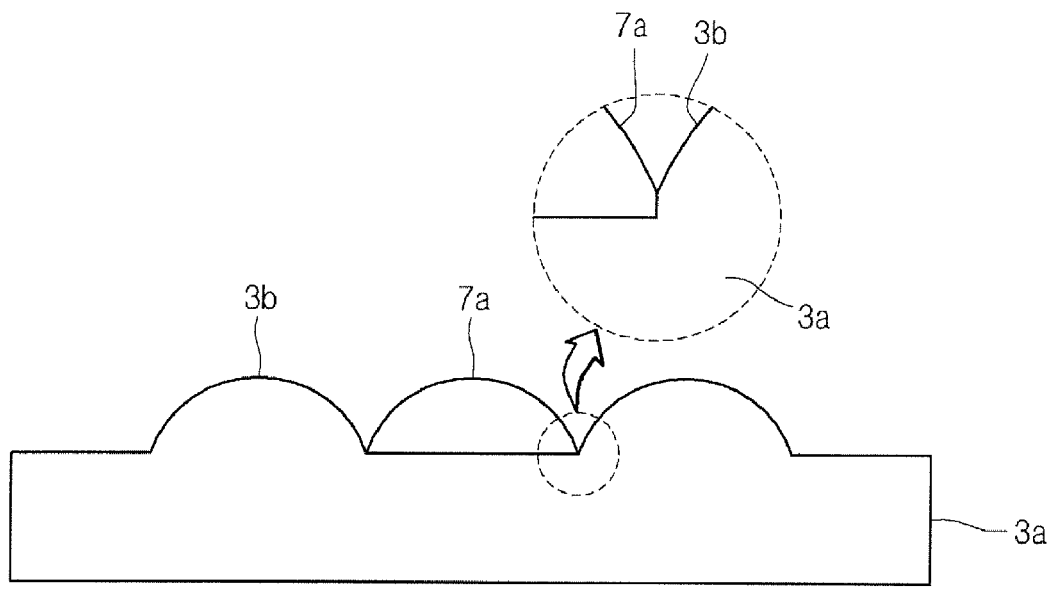
FIG. 8 shows an image sensor according to an embodiment of the present invention, with a close-up showing adjacent microlenses with no lens bridge.

As illustrated in FIG. 8, bridges between the microlens of one pixel with that of neighboring pixels do not occur since the microlenses of alternating pixels are formed of hydrophilic and hydrophobic material, respectively.

The principle of the microlens bridge not forming is similar to the principle that oil drops and water drops do not mix and an evident interface is formed when dropping oil over water. With the fabricating method of the image sensor according to an embodiment of the present invention, the sizes of the patterns of the first set of microlenses 3b, formed of a hydrophilic material, and the second set of microlenses 7a, formed of a hydrophobic material, can be adjusted so that a microlens array having a complete zero gap can be implemented.

In many embodiments, the real reflective index (RI) values of the first set of microlenses 3b and the second set of microlenses 7a are different. Accordingly, the thickness of the microlenses may be adjusted based on the materials of the first and second sets of microlenses. In certain embodiments, the focus distances of the first and second sets of microlenses can be the same.

In an embodiment of a complimentary metal oxide semiconductor (CMOS) type image sensor, the distance from the microlens to the photodiode is about 3 to 4 microns, TEOS having a real reflective index (RI) value of about 1.4 is used as the material of the first set of microlenses, and the thickness of the first set of microlenses is about 450 nm. In an embodiment, the second set of microlenses is formed of a photosensitive film with a real reflective index (RI) value in the wavelengths of visible light of about 1.6 to 1.7, and the thickness of the second set of microlenses is about 350 nm.

The image sensor and the fabricating method according to embodiments of the present invention has the advantages of inhibiting the lens bridge between neighboring pixels of the microlens array from being generated, and forming the microlens array having zero gap, thereby improving the characteristics of the device.

FIGS. 9 to 12 are views showing a fabricating method of an image sensor according to another embodiment.

Figure 9:
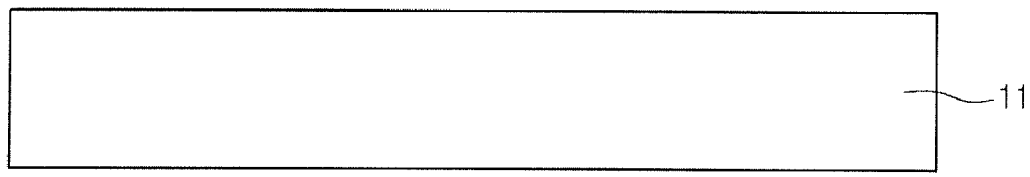
FIGS. 9 to 12 are views showing a fabricating method of an image sensor according to an embodiment of the present invention.

Referring to FIG. 9, a planarization layer 11 can be formed.

The planarization layer 11 can be formed of a material capable of forming a pattern by a photolithography process, such as a photosensitive material. In an embodiment, the planarization layer 11 is formed on a color filter array. In an alternative embodiment that does not include a color filter array, the planarization layer 11 can be formed over a passivation layer.

The material forming planarization layer 11 is capable of transmitting visible light well and, thus, has an imaginary reflective index (k~0). In an embodiment including a color filter layer, a process forming the planarization layer 11 is applied to the image sensor in a mosaic scheme. In an alternative embodiment that does not include a color filter array, the planarization layer 11 can be formed directly on the passivation layer.

Figure 10:
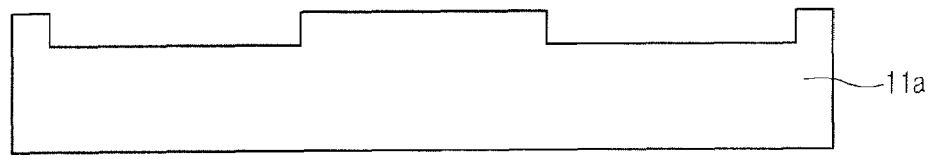

As shown in FIG. 10, in many embodiments, the planarization layer 11 is divided into a first region and a second region, and the regions are patterned such that the upper surface of the second region protrudes more than that of the first region.

In many embodiments, the patterning of the planarization layer 11 is performed by a photolithography process.

In one embodiment, the patterned first and second regions are formed in squares having the size of a pixel pitch. The squares can be patterned in the form of a checkerboard arrangement.

Figure 11:
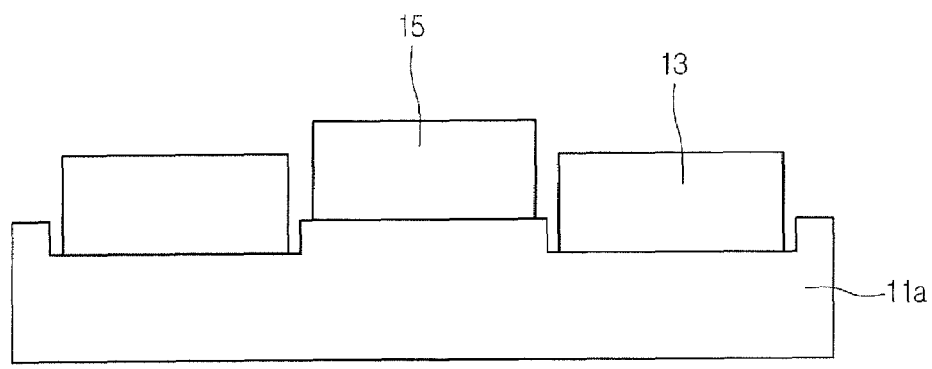

Referring to FIG. 11, a first photosensitive film 13 for forming the microlens array is formed on the first region of the patterned planarization layer 11a, and a second photosensitive film 15 for forming the microlens array is formed on the second region of the patterned planarization layer 11a. In certain embodiments, the first photosensitive film 13 and the second photosensitive film 15 are each formed of a hydrophobic material. In an embodiment, the first photosensitive film 13 and the second photosensitive film 15 are each formed of a hydrophilic material. In an alternative embodiment, the first photosensitive film 13 is formed of a hydrophilic material, and the second photosensitive film 15 is formed of a hydrophobic material.

Figure 12:
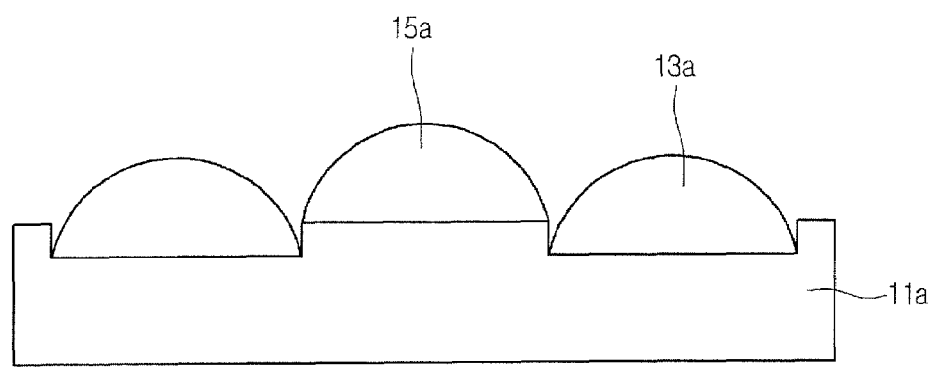

As shown in FIG. 12, in many embodiments, a microlens array is formed by performing heat treatment. In an embodiment, the heat treatment is a thermal reflow.

In many embodiments, a first set of microlenses 13a is formed on the first region 13, and a second set of microlenses 15a is formed on the second region 15 so that the microlens array having first and second sets of microlenses (13a and 15a, respectively) is formed.

In many embodiments, prominences and depressions are formed on the lower layer between the microlenses of neighboring pixels inhibiting the generation of a lens bridge.

The prominences and depressions repeated in the pixels can be formed by using the planarization layer made of, for example, the photosensitive material on the layer below the microlenses, thereby making it possible to effectively inhibit the generation of the lens bridge in the thermal reflow process.

In certain embodiments a lower structure is formed having a photodiode on the lower layer of the planarization layer. In an embodiment, a color filter array is formed on the lower structure.

FIGS. 13 to 17 are views showing a fabrication method of an image sensor according to another embodiment.

Figure 13:
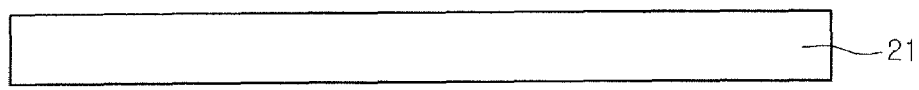
FIGS. 13 to 17 are views showing a fabrication method of an image sensor according to an embodiment of the present invention.

Referring to FIG. 13, a hydrophilic layer 21 can be formed.

The hydrophilic layer 21 can be formed of a low temperature oxide (LTO) material. For example, the hydrophilic layer 21 can be formed of a TEOS material.

In an embodiment, a lower structure is formed having a photodiode below the hydrophilic layer 21. In a further embodiment, a color filter array is formed on the lower structure below the hydrophilic layer 21.

Figure 14:
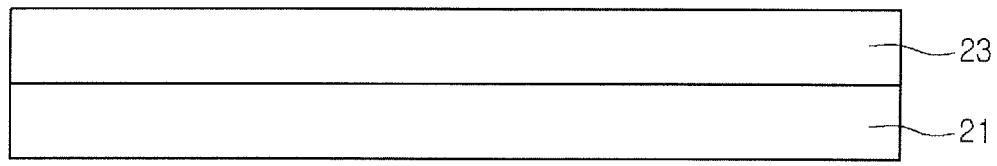
Figure 15:
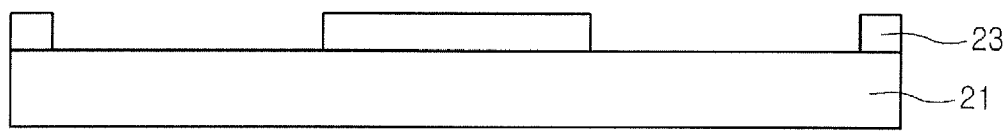

Referring to FIGS. 14 and 15, a planarization layer 23 can be formed over the hydrophilic layer 21, and a patterning process for the planarization layer 23 can be performed.

In certain embodiments, the planarization layer 23 can be divided into a first region and a second region on the hydrophilic layer 21. In an embodiment, the first region is formed so that the hydrophilic layer 21 is exposed, and the second region is formed so that hydrophilic layer 21 is not exposed. The patterned planarization layer 23 is formed in such a way that it will not reflow in a subsequent heating process.

Figure 16:
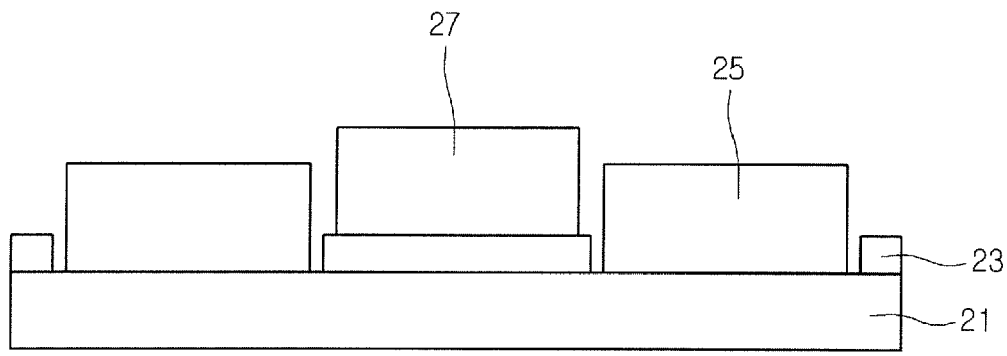

Referring to FIG. 16, a first photosensitive film 25 for forming the microlens array is formed on the first region in which the hydrophilic layer 21 is exposed, and a second photosensitive film 27 for forming the microlens array is formed on the second region in which the hydrophilic layer 21 is not exposed. In an embodiment, the first and second photosensitive films (25 and 27, respectively) are each formed of a hydrophobic material. In an alternative embodiment, the first and second photosensitive films (25 and 27, respectively) are each formed of a hydrophilic material. In a further embodiment, the first photosensitive film 25 is formed of a hydrophilic material, and the second photosensitive film 27 is formed of a hydrophobic material.

Figure 17:
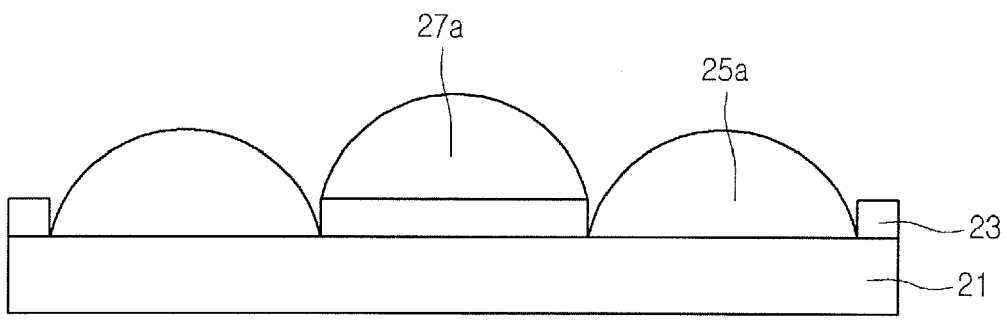

As shown in FIG. 17, in certain embodiments, a microlens array is formed by performing heat treatment. In an embodiment, the heat treatment is thermal reflow.

In certain embodiments, a first set of microlenses 25a is formed on the first region, and a second set of microlenses 27a is formed on the second region, so that the microlens array having first and second sets of microlenses (25a and 27a, respectively) is formed. In an embodiment where the first and second sets of microlenses are formed of hydrophobic material, the base width of each microlens in the first set of microlenses 25a is greater than the base width of each microlens in the second set of microlenses 27a. This base width adjustment can be done for cases where the second photosensitive film 27 reflows quicker than the first photosensitive film 25.

In many embodiments, prominences and depressions are formed on the lower layer between the microlenses of neighboring pixels inhibiting the generation of a lens bridge in the thermal reflow process.

In an embodiment, the hydrophilic layer 21 is formed below the planarization layer 23 so that the concave portion of the prominence and depression has the hydrophilic property of the hydrophilic layer 21, and the convex portion thereof has the hydrophobic property of the planarization layer 23. Accordingly, when a hydrophilic surface and a hydrophobic surface are formed so that the microlens is formed, the hydrophilic/hydrophobic surfaces are repeated every other pixel in the arrangement of a checkerboard. When performing the thermal reflow for the photosensitive film, which is the hydrophobic material, the prominences and depressions formed on the lower layer controls the force to be reflowed, and the hydrophilic/hydrophobic surfaces control surface tension, thereby making it possible to inhibit the generation of a lens bridge.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a microlens array formed on a substrate and comprising a first set of microlenses and a second set of microlenses; and
    a hydrophilic material layer comprising trenches arranged in checkerboard pattern formed on the substrate;
    wherein the first set of microlenses and the second set of microlenses are arranged in a checkerboard pattern, and
    wherein the first set of microlenses are formed in the trenches of the hydrophilic material layer, and the second set of microlenses are formed on top surfaces of the hydrophilic material layer.

2. The image sensor according to claim 1, wherein the first set of microlenses comprises a hydrophilic material, and the second set of microlenses comprises a hydrophobic material.

3. The image sensor according to claim 2, wherein a portion of the hydrophilic material used to form the first set of microlenses remains on the substrate below the first and second set of microlenses.

4. The image sensor according to claim 1, wherein both the first set of microlenses and the second set of microlenses comprise a hydrophobic material.

5. An image sensor comprising:
    a microlens array formed on a substrate and comprising a first set of microlenses and a second set of microlenses;
    a hydrophilic material layer formed on the substrate; and
    a patterned hydropbobic material layer formed on the hydrophilic material layer in a checkerboard arrangement,
    wherein the first set of microlenses and the second set of microlenses are arranged in a checkerboard pattern, and
    wherein the first set of microlenses are formed on the hydrophilic material layer and the second set of microlenses are formed on the patterned hydrophobic material layer.

6. The image sensor according to claim 5, wherein both the first set of microlenses and the second set of microlenses comprise a hydrophobic material 7. A method of fabricating an image sensor, comprising:
    forming a microlens array on a substrate, the microlens array comprising a first set of microlenses and a second set of microlenses,
    wherein the first set of microlenses and the second set of microlenses are arranged in a checkerboard pattern; and
    wherein forming the microlens array comprises:
    forming a planarization layer on a substrate;
    forming a first photosensitive film patterned in a checkerboard arrangement on the planarization layer;
    forming sacrificial microlenses on the planarization layer by performing a heat treatment for the patterned first photosensitive film;
    forming the first set of microlenses by etching the planarization layer using the sacrificial microlenses;
    forming a second photosensitive film patterned in the space between adjacent microlenses of the first set of microlenses; and
    forming the second set of microlenses by performing a heat treatment for the patterned second photosensitive film.

8. The method according to claim 7, wherein the planarization layer comprises a hydrophilic material capable of being etched by means of a dry etching.

9. The method according to claim 8, wherein the planarization layer comprises a low temperature oxide (LTO).

10. The method according to claim 7, wherein the first and second photosensitive films comprise a hydrophobic material.

11. A method of fabricating image sensor, comprising:
    forming a microlens array on a substrate the microlens array comprising a first set of microlenses and a second set of microlenses,
    forming a planarization layer on the substrate; and
    patterning the planarization layer to form trenches arranged in a checkerboard pattern,
    wherein the first set of microlenses and the second set of microlenses are arranged in a checkerboard pattern; and
    wherein forming the microlens array comprises:
    forming the first set of microlenses in the trenches of the planarization layer and the second set of microlenses on top surfaces of the planarization layer.

12. The method according to claim 11, wherein the planarization layer comprises a hydrophilic material and the first and second set of microlenses comprise a hydrophobic material.

13. The method according to claim 11, wherein forming the first set of microlenses and the second set of microlenses comprises:
    depositing and patterning a first photosensitive film on the trenches of the planarization layer;
    depositing and patterning a second photosensitive film on the top surfaces of the planarization layer; and
    performing a reflow process for the first and second patterned photosensitive films.

14. A method of fabricating an image sensor, comprising:
    forming a microlens array on a substrate, the microlens array comprising a first set of microlenses and a second set of microlenses,
    forming a hydrophilic material layer on the substrate; and
    forming a patterned hydrophobic material layer on the hydrophilic layer in a checkerboard arrangement,
    wherein the first set of microlenses and the second set of microlenses are arranged in a checkerboard pattern; and
    wherein forming the array of microlenses comprises:
    forming the first set of microlenses on the exposed hydrophilic material layer; and forming the second set of microlenses on the patterned hydrophobic material layer.

15. The method according to claim 14, wherein both the first set of microlenses and the second set of microlenses comprise a hydrophobic material.

16. The method according to claim 14, wherein forming the first set of microlenses and forming the second set of microlenses comprises:

depositing and patterning a first photosensitive film on the exposed hydrophilic material layer;

depositing and patterning a second photosensitive film on the patterned hydrophobic material layer; and performing a reflow process for the first and second patterned photosensitive films.

17. The method according to claim 16, wherein the patterned hydrophobic material layer has a narrower width than the exposed hydrophilic material layer.

* * * * *